US012541067B2

(12) United States Patent
Darmawikarta et al.

(10) Patent No.: US 12,541,067 B2
(45) Date of Patent: Feb. 3, 2026

(54) SUBSTRATE CAVITY WITH STEPPED WALLS

(71) Applicant: Intel Corporation, Santa Clara, CA (US)

(72) Inventors: Kristof Darmawikarta, Chandler, AZ (US); Xiao Di Sun Zhou, Tempe, AZ (US); Tarek A. Ibrahim, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 1077 days.

(21) Appl. No.: 17/358,530

(22) Filed: Jun. 25, 2021

(65) Prior Publication Data

US 2022/0413235 A1    Dec. 29, 2022

(51) Int. Cl.
| | | |
|---|---|---|
| *G02B 6/42* | (2006.01) | |
| *H01L 23/00* | (2006.01) | |
| *H01L 23/367* | (2006.01) | |
| *H01L 25/16* | (2023.01) | |

(52) U.S. Cl.
CPC ......... *G02B 6/4256* (2013.01); *G02B 6/4204* (2013.01); *H01L 23/3672* (2013.01); *H01L 24/16* (2013.01); *H01L 25/167* (2013.01); *H01L 2224/16145* (2013.01); *H01L 2224/16227* (2013.01)

(58) Field of Classification Search
CPC . G02B 6/4256; G02B 6/4204; H01L 23/3672; H01L 24/16; H01L 25/167; H01L 2224/16145; H01L 2224/16227
See application file for complete search history.

(56) References Cited

U.S. PATENT DOCUMENTS

| | | | | |
|---|---|---|---|---|
| 5,877,038 | A * | 3/1999 | Coldren | H01S 5/18316 438/39 |
| 6,653,158 | B2 * | 11/2003 | Hall | B82Y 20/00 438/37 |
| 6,687,281 | B2 * | 2/2004 | Coldren | H01S 5/18316 372/99 |
| 6,714,573 | B2 * | 3/2004 | Coldren | H01S 5/18344 472/46 |
| 6,798,817 | B2 * | 9/2004 | Coldren | H01S 5/18341 372/99 |

(Continued)

OTHER PUBLICATIONS

Aleksov et al., "Organic Package Substrates Using Lithographic Via Technology for RF to THz Applications," 2020 IEEE International Electron Devices Meeting (IEDM), San Francisco, CA, USA, 2020, pp. 17.5.1-17.5.4 (Year: 2020).*

(Continued)

*Primary Examiner* — Peter Radkowski
(74) *Attorney, Agent, or Firm* — Schwabe, Williamson & Wyatt P.C.

(57) ABSTRACT

Embodiments described herein may be related to apparatuses, processes, and techniques related to creating deep cavities within a substrate or at an edge of the substrate, by etching a cavity in the substrate to a first copper stop layer, removing the first copper stop layer, and then etching deeper into the cavity to a second copper stop layer. In embodiments this process may be repeated until the desired cavity depth is reached. Other embodiments may be described and/or claimed.

20 Claims, 11 Drawing Sheets

(56) References Cited

U.S. PATENT DOCUMENTS

| | | | | |
|---|---|---|---|---|
| 6,810,064 B1* | 10/2004 | Coldren | ................ | B82Y 20/00 |
| | | | | 372/96 |
| 6,841,407 B2* | 1/2005 | Coldren | ............. | H01S 5/18341 |
| | | | | 438/22 |
| 9,312,198 B2* | 4/2016 | Meyer | .................... | H01L 24/24 |
| 9,985,005 B2* | 5/2018 | Meyer | ................ | H01L 23/3107 |
| 10,985,285 B2* | 4/2021 | Yonkee | ............ | H01L 21/02579 |
| 11,532,922 B2* | 12/2022 | Forman | .............. | H01S 5/02469 |
| 2002/0024989 A1* | 2/2002 | Coldren | ............. | H01S 5/18341 |
| | | | | 372/96 |
| 2002/0025589 A1* | 2/2002 | Hall | ................... | H01S 5/18341 |
| | | | | 438/22 |
| 2002/0071464 A1* | 6/2002 | Coldren | ............. | H01S 5/18341 |
| | | | | 372/45.01 |
| 2002/0090016 A1* | 7/2002 | Coldren | ................ | B82Y 20/00 |
| | | | | 372/96 |
| 2002/0101894 A1* | 8/2002 | Coldren | ............. | H01S 5/18316 |
| | | | | 216/11 |
| 2014/0264914 A1* | 9/2014 | Meyer | ................ | H01L 23/3107 |
| | | | | 257/774 |
| 2016/0190107 A1* | 6/2016 | Meyer | ................ | H01L 25/0657 |
| | | | | 257/686 |
| 2017/0236807 A1* | 8/2017 | Hwang | ................ | H10H 20/825 |
| | | | | 257/90 |
| 2019/0207043 A1* | 7/2019 | Yonkee | ............ | H10H 20/01335 |
| 2020/0244036 A1* | 7/2020 | Forman | ............... | H01S 5/02355 |
| 2022/0239068 A1* | 7/2022 | Kearns | ................ | H01S 5/18341 |

OTHER PUBLICATIONS

Asano et al., "InP-based all-epitaxial 1.3-μm VCSELs with selectively etched AlInAs apertures and Sb-based DBRs," in IEEE Photonics Technology Letters, vol. 15, No. 10, pp. 1333-1335, Oct. 2003 (Year: 2003).*

Holder et al., Nonpolar III-nitride vertical-cavity surface emitting lasers with a polarization ratio of 100% fabricated using photoelectrochemical etching. Appl. Phys. Lett. Jul. 21, 2014; 105 (3): 031111 (Year: 2014).*

Long et al., Polarization mode control of long-wavelength VCSELs by intracavity patterning, Opt. Express 24, 9715-9722 (2016) (Year: 2016).*

* cited by examiner

SUBSTRATE CAVITY WITH STEPPED WALLS

FIELD

Embodiments of the present disclosure generally relate to the field of semiconductor packaging, and in particular to forming cavities within a package substrate.

BACKGROUND

Continued growth in computing and mobile devices will continue to increase the demand for increased bandwidth density between dies within semiconductor packages.

DETAILED DESCRIPTION

Embodiments described herein may be related to apparatuses, processes, and techniques related to creating deep cavities within a substrate or at an edge of the substrate. A deep cavity formation, for example a cavity with a depth greater than 200 µm, is desired as it opens package and system architecture to additional optical components integration within a package. For example, a deep cavity may house a photonics integrated circuit (PIC), which may be directly connected to a logic die, thereby giving an operational performance benefit given the proximity of the PIC to the logic die. If one or more deep cavities are formed on the edge of the package, then other optical components, such as a lens to aid optical coupling with the PIC, can also be housed directly on the substrate within the cavity.

Next generation server high speed communication protocols are expected to rely heavily on optical interconnects. As such, high-density interconnect substrate packages need to accommodate multiple photonic devices. Embodiments described herein may be directed to using a substrate cavity drilling process, for example, a drilling process used to create cavities for an embedded multi-die interconnect bridge (EMIB) multiple times to form a deep cavity within the substrate. Using these techniques to place multiple PICs and/or other optical components within deep cavities at the edge of a substrate will facilitate a high density of photonic devices within a package.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1:
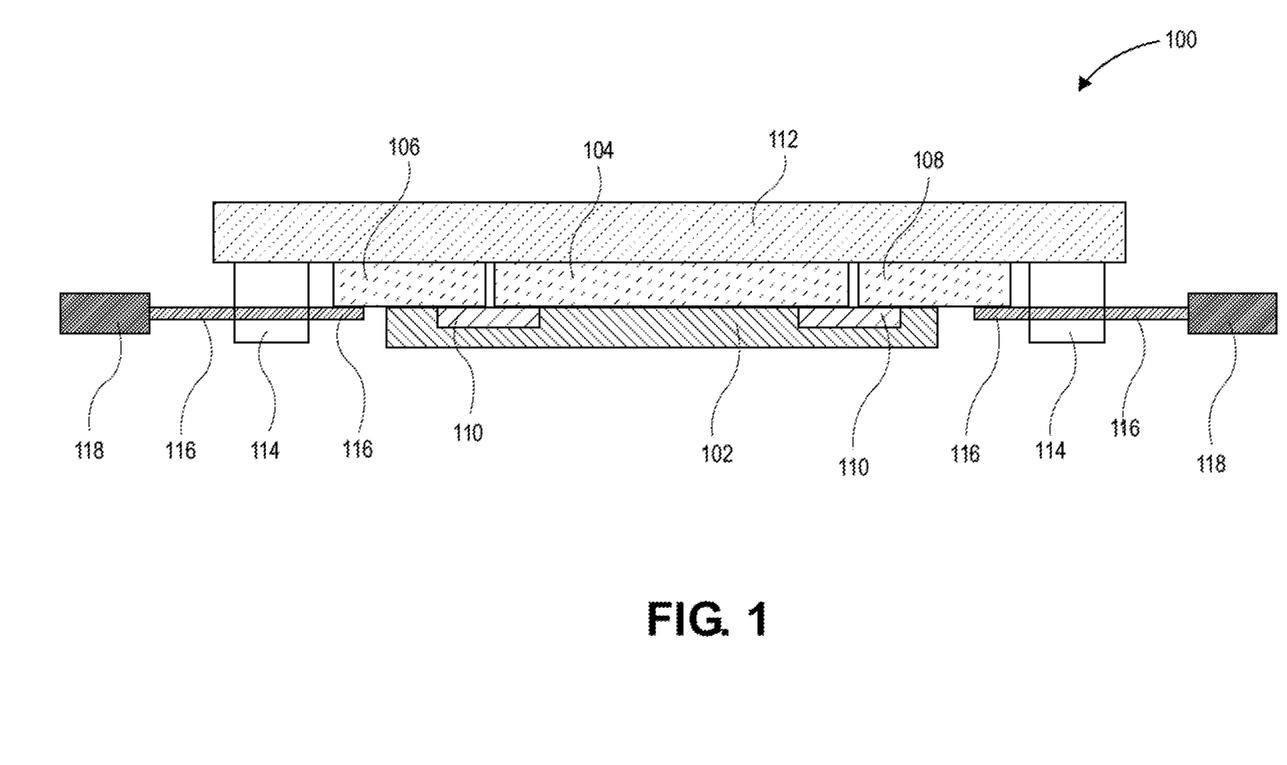
FIG. 1 illustrates a block diagram side view of a legacy implementation of multichip packaging.

FIG. 1 illustrates a block diagram side view of a legacy implementation of multichip packaging. Package 100 shows a substrate 102 on to which a system-on-a-chip (SOC) 104 and two PICs 106, 108 are coupled. The SOC 104 and PICs 106, 108 are electrically coupled with one or more EMIBs 110. The cavities into which the EMIBs 110 are placed within the substrate 102 may be formed using drilling techniques into the substrate 102 prior to assembly.

The top of an SOC 104, and PICs 106, 108 may be thermally coupled with an integrated heat spreader (IHS) 112. Physical supports 114 may be physically coupled with the IHS 112 to provide support for optical lines 116 that extend from an optical connector 118 to the PICs 106, 108. External optical fiber bundles may then be coupled with the optical connector 118, which may be, for example, a V-groove connection, at the sides of the package 100. The package 100 shows a legacy architecture to support multi-chip packaging with photonic devices.

Figure 2:
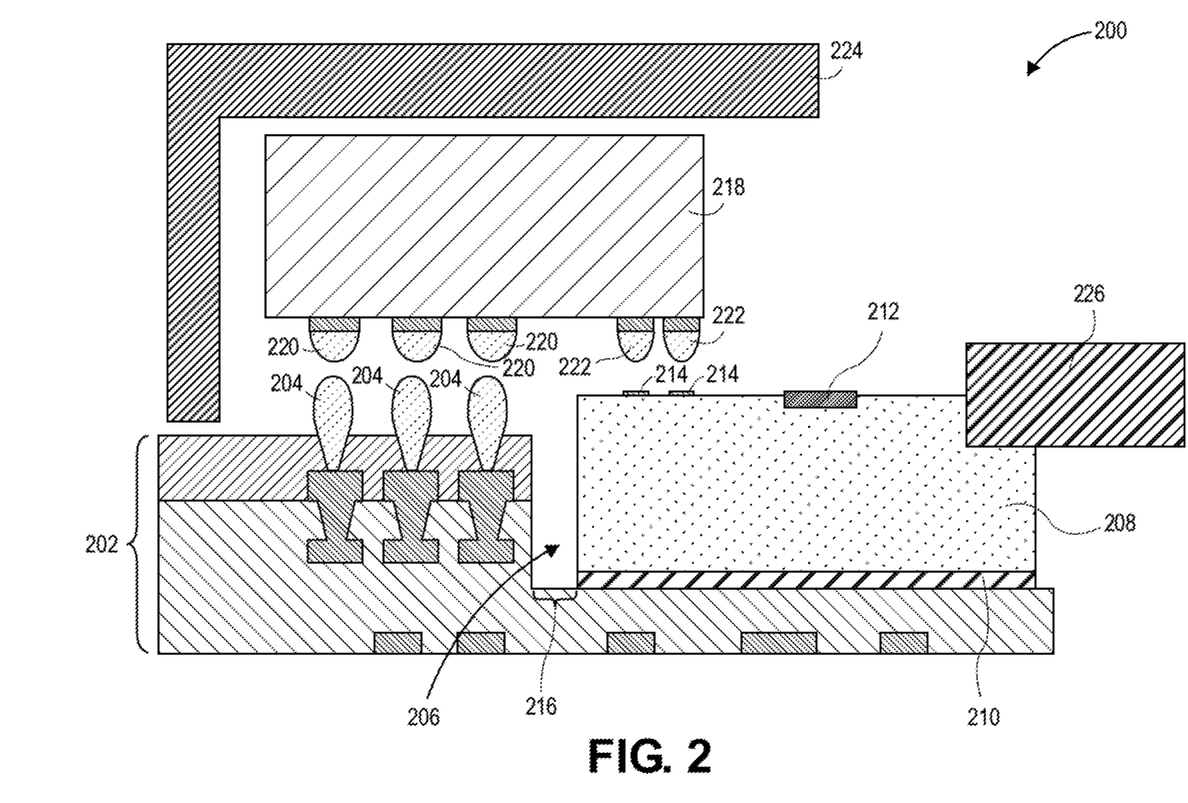
FIG. 2 illustrates a block diagram side view of a legacy package that includes a photonics integrated circuit (PIC) placed within a substrate cavity.

FIG. 2 illustrates a block diagram side view of a legacy package that includes a photonics integrated circuit (PIC) placed within a substrate cavity. Legacy package 200 shows an open cavity PIC schematic that includes a substrate 202 with a first set of bumps 204 at a top side of the substrate 202. A cavity 206 has been removed from the substrate 202, into which a PIC 208 has been inserted. The PIC 208 may be coupled to the bottom of the cavity 206 using a solder 210, or some other adhesive material.

The top side of the PIC 208 may include one or more laser elements 212 at the top of the PIC 208, as well as one or more electrical connectors 214 positioned at the top of the PIC 208 and close to the substrate 202 bumps 204. Due to the cavity 206 manufacturing process, there is a gap 216 between an edge of the PIC 208 and an edge of the substrate 202 based upon the legacy manufacturing methods of the cavity 206.

An electronic integrated circuit (EIC) 218 is physically and/or electrically coupled with the substrate 202 and the PIC 208. In particular, EIC 218 bumps 220 are to couple with substrate 202 bumps 204, and EIC 218 bumps 222 are to couple with PIC 208 electrical connectors 214. The PIC 208 is only electrically coupled with the substrate 202 via the EIC 218. An integrated heat spreader (IHS) 224 is thermally coupled with the substrate 202, with the EIC 218, and with other components (not shown). A fiber attach 226 may be coupled with a side of the PIC 208, and may be a V-groove fiber alignment.

Optical interconnects offer very high bandwidths compared to electrical interconnects. PICs are used to convert electrical signal to optical signals. Open cavity based integration of PICs, where the PICs are placed within a cavity in a substrate, offers direct PIC to EIC connection for better power efficiency, clean access for fiber attach and access to hotspots on PIC for cooling. Also, fiber attach methods such as V-groove fiber alignment may be accomplished when the PIC is ~200 um or more thick. In embodiments, the thicker the PIC, the deeper the cavity into which the PIC is placed.

Legacy manufacturing techniques for deep cavities within substrates use laser ablating techniques applied either the outline of the cavity or the entire cavity. These legacy techniques lead to sloping edges of the cavity walls. Also, it is desired to have solder-based PIC attach, to adjust a level of the top of a PIC within the cavity for Z height control. A solder paste printing technique or ball drop technique may be used to place the solder inside the cavity prior to inserting the PIC. However, the stencil used for these legacy solder placement operations need to rest on the edge of the substrate adjacent to the cavity, resulting in a stencil keep out zone (KOZ) on the substrate next to the cavity. This results in a first substrate bump that may be at a significant distance from a first PIC bump. This legacy situation increases power efficiency losses. In addition, the PIC power supply route through EIC becomes longer, which leads to more voltage drop.

There are other challenges to these legacy implementations. For example, a thin PIC, for example approximately 50 μm to 60 μm, can sit on a buildup layer underneath solder resist in a cavity opening, which allows for micro ball drop in buildup layer openings, however the thin PIC cannot support the groove-based fiber attach such as fiber attach 126. In addition, non-solder based attach eliminates some of the stencil KOZs, however a solder based attach helps absorb high Z-height variation in thicker PIC 208 and deeper cavity 206 to make sure the PIC 208 to EIC 218 bonding (or other top die bonding), can happen at a tight pitch. Finally, pin dip based solder transfer, or using a compliant adhesive, may eliminate stencil related KOZs, but deep cavities may have large sloping edges that will increase the distance of the gap 216. Thus, in practical legacy implementations, those KOZs may not be avoidable.

Figure 3:
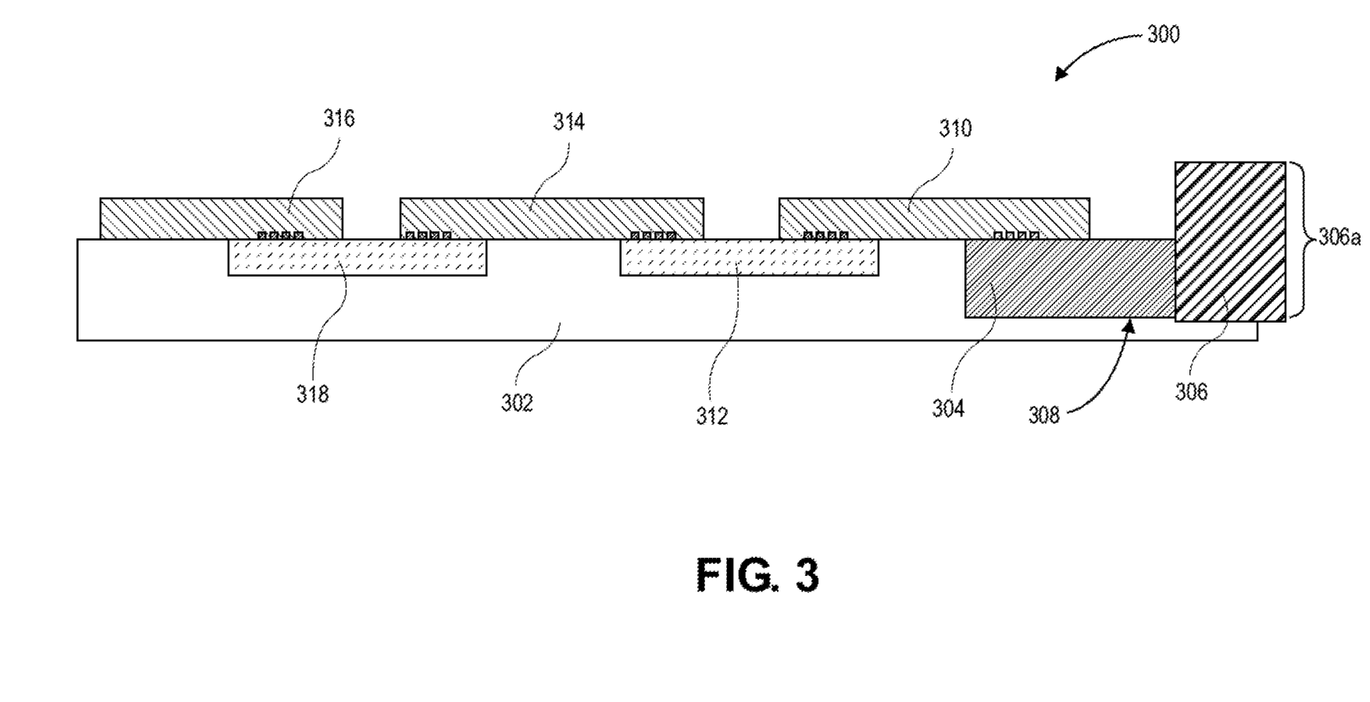
FIG. 3 illustrates a block diagram side view of a deep cavity at the edge of the package that includes optical components, in accordance with various embodiments.

FIG. 3 illustrates a block diagram side view of a deep cavity at the edge of the package that includes optical components, in accordance with various embodiments. Package 300 includes a substrate 302 into which a PIC 304 and a lens 306 optically coupled with the PIC 304 are placed within a deep cavity 308 within the substrate 302. In other embodiments, the lens 306 may be another optical component, for example an optical coupler that may be used to receive bundles of optical fibers. As shown, a height 306a of the lens 306 may be 500 μm, thus, the depth of the cavity 308 must be sufficient to recess the lens 306 to accommodate the architecture of the package 300. In embodiments, a X-Y dimension of the deep cavity 308 may be up to 20 mm in either dimension.

In embodiments, an electrical integrated circuit (EIC) 310 may be electrically coupled with the PIC 304 using an EMIB 312 that is recessed within the substrate 302. In embodiments, the EIC 310 may provide electrical power to the PIC 304. Additionally, EMIB 312 may also electrically couple with an application-specific integrated circuit (ASIC) 314, which may be in turn electrically coupled with a field programmable gate array (FPGA) 316 via another EMIB 318. In embodiments, the ASIC 314 and the FPGA 316 may be any die type or die complex, for example a compute die.

Figure 4:
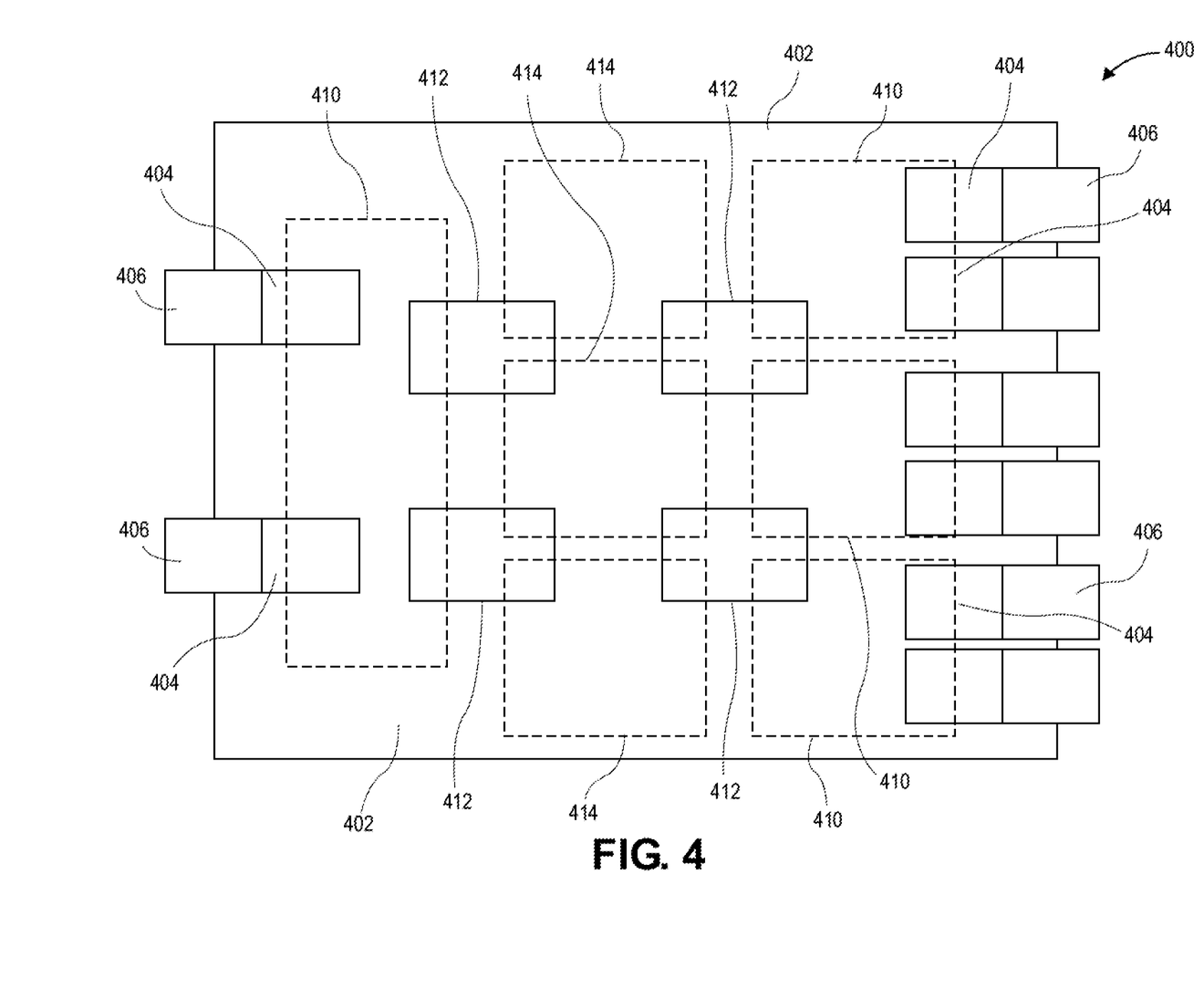
FIG. 4 illustrates a block diagram top view of a plurality of deep cavities at an edge of a package that includes optical components, in accordance with various embodiments.

FIG. 4 illustrates a block diagram top view of a plurality of deep cavities at an edge of a package that includes optical components, in accordance with various embodiments. Package 400, which may be similar to package 300 of FIG. 3, shows a substrate 402 into which a plurality of PIC 404 and lenses 406 are inserted, respectively, into a plurality of cavities within substrate 402. In embodiments, the PICs 404 and lenses 406 are located at an edge of the substrate 402, providing access to fiber optic components (not shown) to which the lenses 406 may be optically coupled. As shown, the substrate 402, the PIC 404, and lens 406 may be similar to substrate 302, PIC 304, and lens 306 of FIG. 3.

The plurality of PICs 404 may be electrically coupled, respectively, with one or more EIC 410, which may be similar to EIC 310 of FIG. 3. In embodiments, the EIC 410 may provide power to the PICs 404, as well as provide digital and/or other signals between the EIC 410 and the PIC 404. In embodiments, the EIC 410 may be electrically coupled with an EMIB 412, where the EMIB 412 is placed within a cavity of the substrate 402. In embodiments, the EMIB 412 may be any version of a high-speed interconnect bus, including a omnidirectional interconnect (ODI).

The EMIB 412 may electrically couple with a compute die 414. In embodiments, the compute die may be a compute complex, an FPGA, an ASIC, an XPU, a graphics processor unit (GPU), or some other die or die complex. As shown with respect to package 400, the cavities in the substrate 402 into which the PIC 404 and lens 406 are placed, as well as the cavities in the substrate 402 into which the EMIB 412 are placed, may be formed using embodiments of the processes and techniques described herein. In embodiments, some of these techniques may include the use of a standard CO2 laser drilling process.

Figure 5:
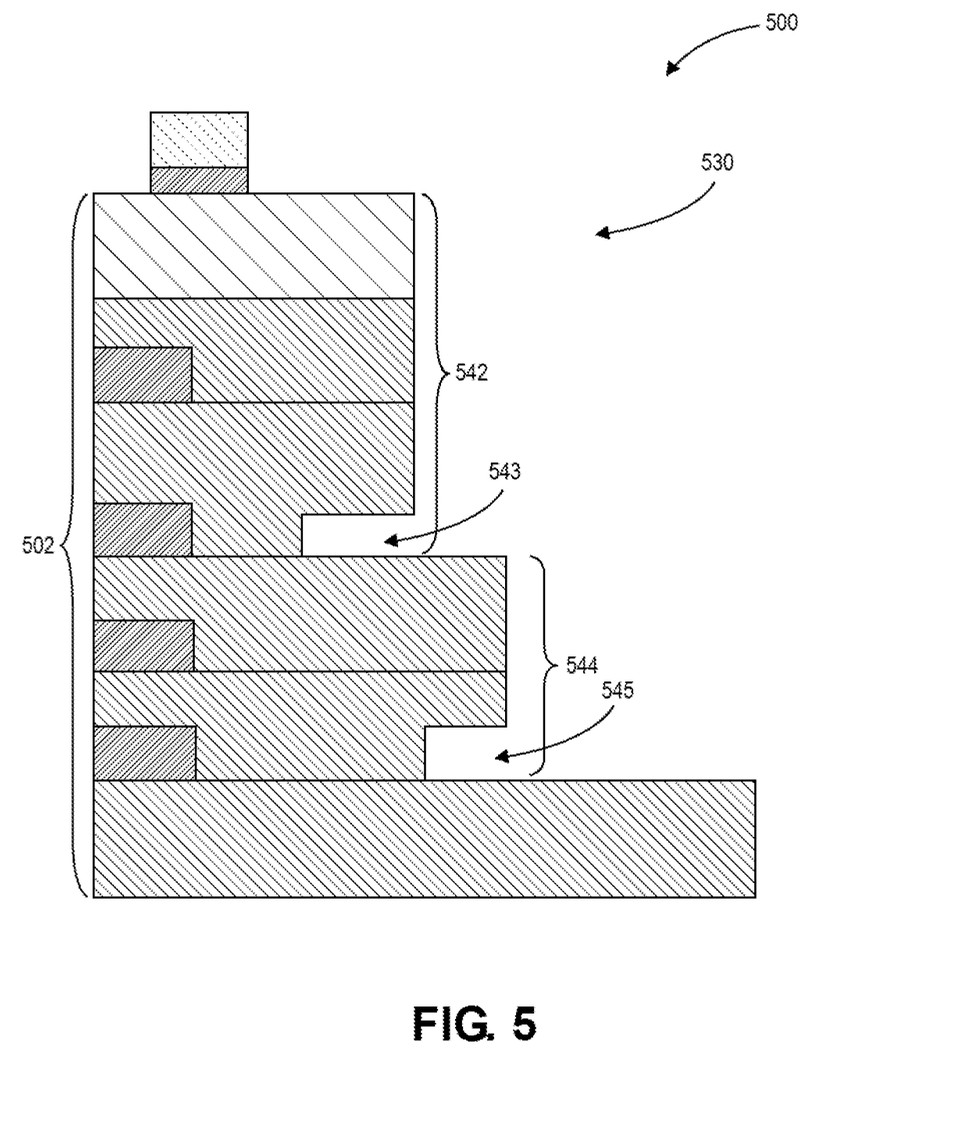
FIG. 5 illustrates a cross-section of a deep cavity, in accordance with various embodiments.

FIG. 5 illustrates a cross-section of a deep cavity, in accordance with various embodiments. Cavity 500 shows a substrate 502, which may be similar to substrate 402 of FIG. 4, that has been created using techniques described herein. A sidewall 530 of the cavity 500 within substrate 502 may include multiple layers as shown. In particular, the wall 530 may show a series of stepped layers 542, 544 that have been etched through at least some of the layers of the substrate 502.

It should be noted that at the bottom layer of each step there is an undercut 543, 545 where a sacrificial copper stop pad existed within one of the layers of substrate 502 that was etched away during the cavity formation process. In embodiments, a standard CO2 laser skiving/drilling process is used to create deep cavities, with deep cavity formation split into multiple shallow cavities, shown with respect to stepped layers 542, 544, each of the multiple shallow cavities using copper stop pads as discussed further below.

Figure 6A:
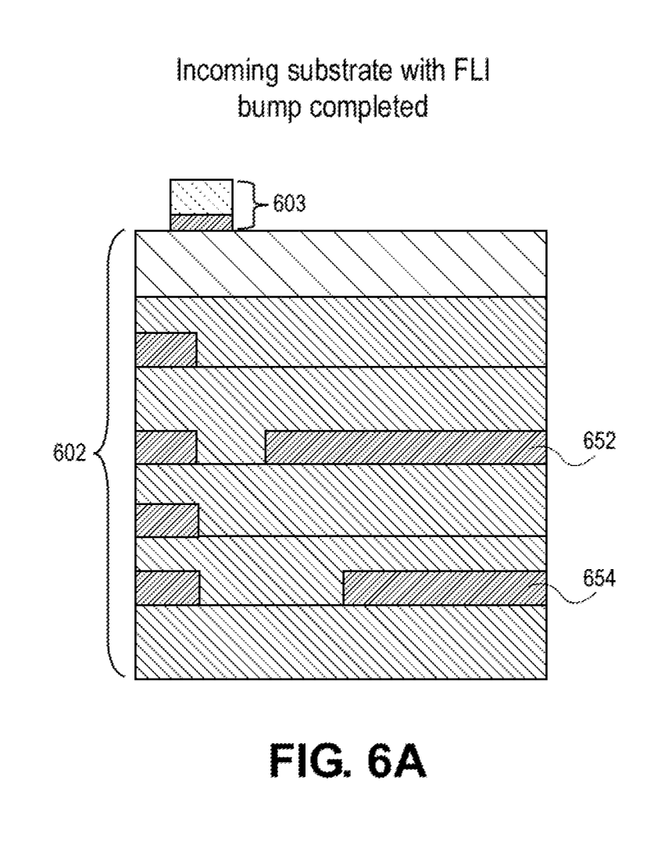
FIGS. 6A-6G illustrate stages in a manufacturing process for creating a deep cavity within a substrate, in accordance with various embodiments.

FIGS. 6A-6G illustrate stages in a manufacturing process for creating a deep cavity within a substrate, in accordance with various embodiments. FIG. 6A shows a substrate 602, which may be similar to substrate 502 of FIG. 5. The substrate 602 may have has multiple layers, with some of the layers including copper stop pads 652, 654 that are a part of the layers. In embodiments, the layers, including copper stop pads 652, 654, may be created as a part of a build-up process when the substrate 602 is being created. In embodiments, first level interconnect (FLI) bumps 603 may be placed on top of the substrate 602. In embodiments, the FLI bumps 603 may be microball or electrolytically plated metal bumps, for example Cu/Au, Cu/Ni/Sn.

The copper stop pads 652, 654 are used to avoid damage to the substrate if the deep cavity is drilled all at once. By splitting the cavity depth into multiple shallow cavities, standard cavity drilling processes, for example those used to drill cavities for EMIBs, may be used. In embodiments, this technique will create a unique, distinguishable undercut and stepped profile as shown above with respect to FIG. 5.

Figure 6B:
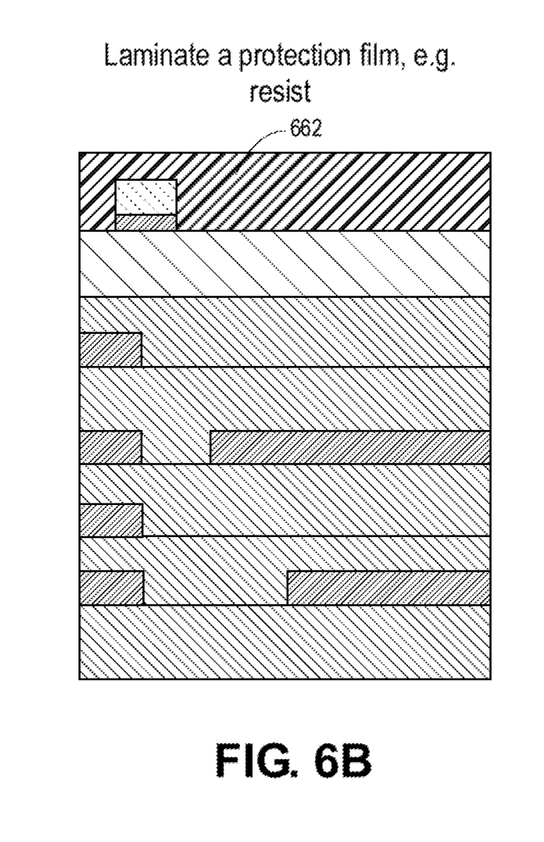

FIG. 6B, in embodiments, shows a laminate protection film 662 that may be placed on top of the substrate 602 and FLI 603. In embodiments, the laminate protection film 662 may a photoresist film. The laminate may protect the FLI 603 during the laser drilling and etching of the copper stop pads.

Figure 6C:
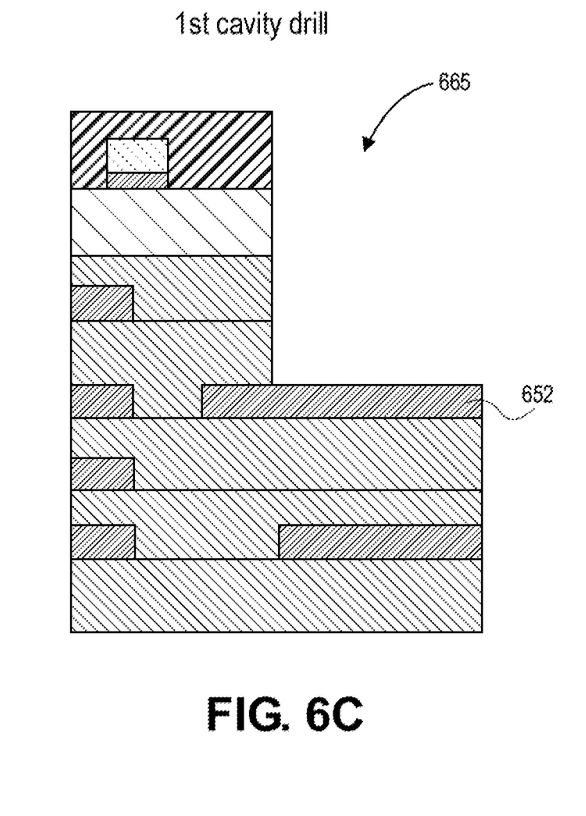

FIG. 6C, in embodiments, shows a first cavity drill 665 that removes layers above a first etch stop 652.

Figure 6D:
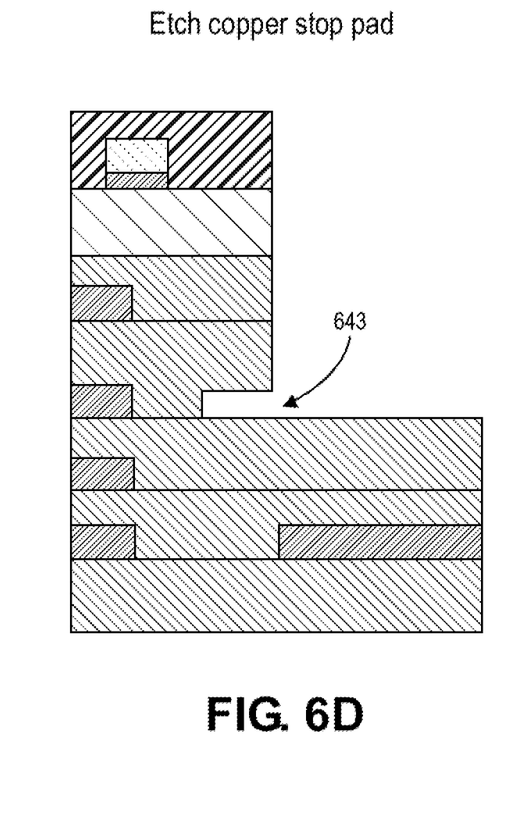

FIG. 6D, in embodiments, shows the result of an etch of the copper stop pad 652 to create an undercut 643, which may be similar to undercut 540 the of FIG. 5.

Figure 6E:
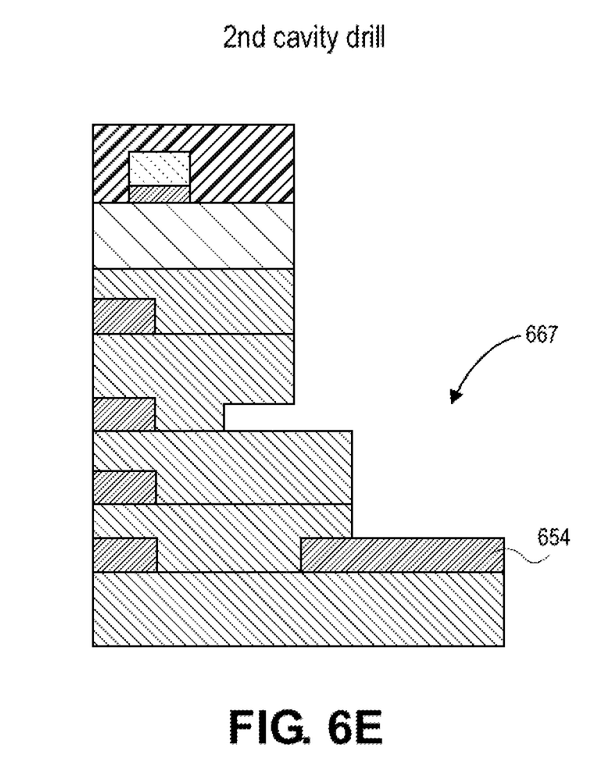

FIG. 6E, in embodiments, shows the result of a second cavity drill that removes substrate 602 layers above the second copper etch stop 654.

Figure 6F:
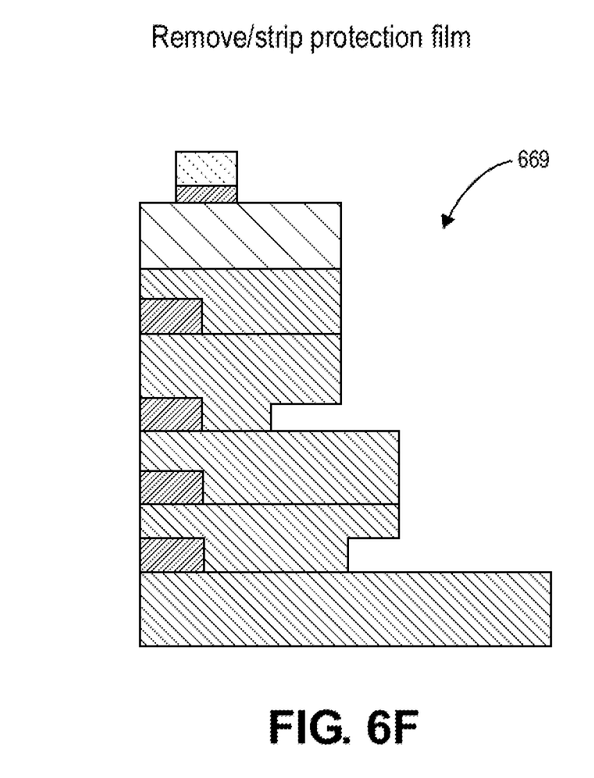

FIG. 6F, in embodiments, shows the result of an etch of the copper stop pad 654, as well as the removal of the laminate protection film 662. The result is a deep cavity 669, which is a combination of cavities 665 and 667. It should be appreciated that in embodiments, the process stages shown in FIG. 6E and FIG. 6F may be repeated multiple times to make a deeper cavity.

Figure 6G:
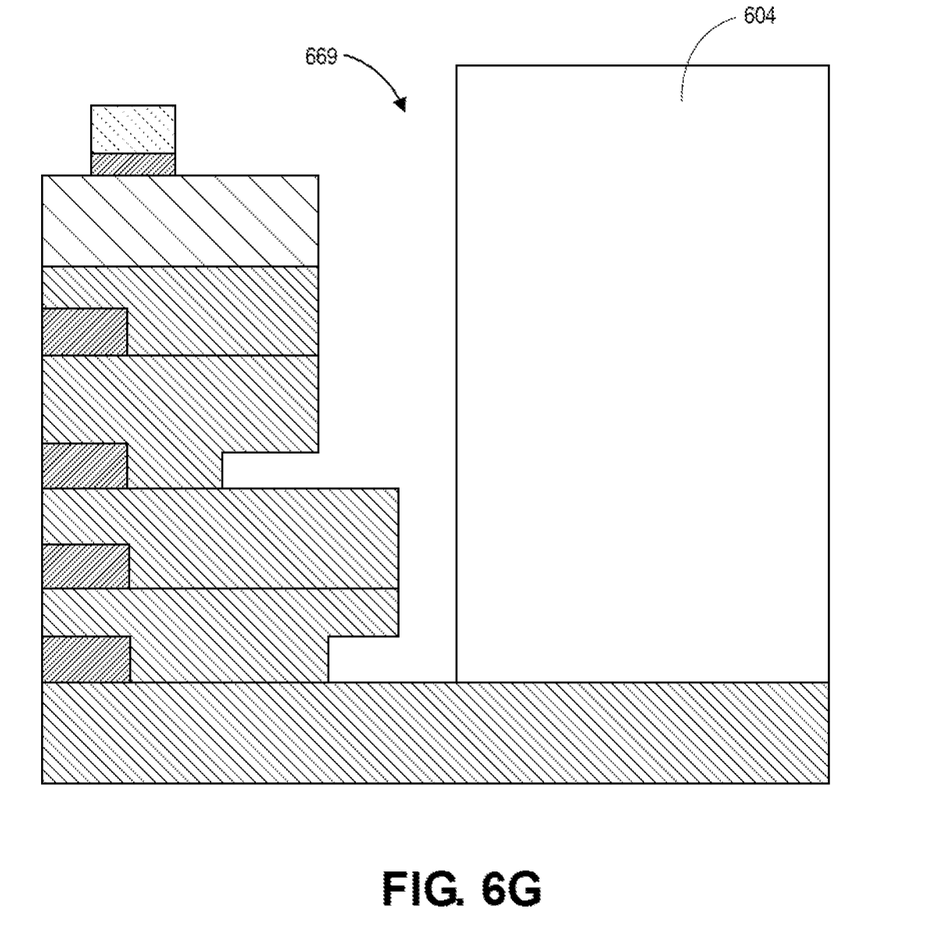

FIG. 6G shows an optical component 604, which may be similar to PIC 304 of FIG. 3, placed within the cavity 669. Subsequent manufacturing stages may include applying an underfill or some other material into the cavity 669 to fill any voids between the layers of the substrate 602 and a side of the optical component 604.

Figure 7:
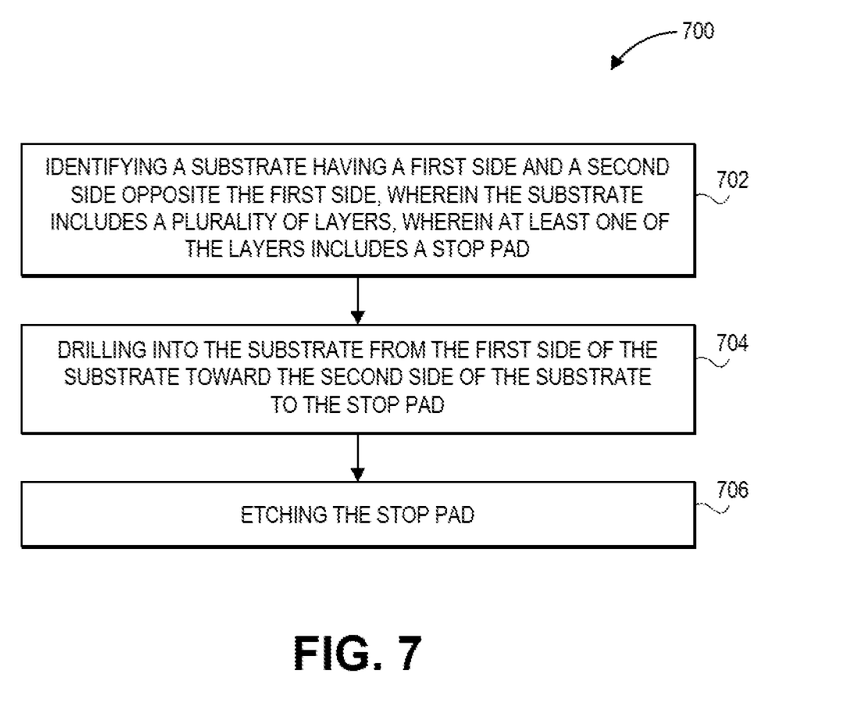
FIG. 7 illustrates an example of a process for creating a deep cavity within a substrate, in accordance with various embodiments.

FIG. 7 illustrates an example of a process for creating a deep cavity within a substrate, in accordance with various embodiments. Process 700 may be performed using the techniques, methods, systems, and/or apparatus as described herein and particularly with respect to FIGS. 1-6G.

At block 702, the process may include identifying a substrate having a first side and a second side opposite the first side, wherein the substrate includes a plurality of layers, wherein at least one of the layers includes a stop pad. In embodiments, the substrate may be similar to substrate 302 of FIG. 3, 402 of FIG. 4, 502 of FIG. 5, or 602 of FIG. 6A-6G. In embodiments, the stop pad may be similar to copper stop pad 652, 654 of FIG. 6A.

At block 704, the process may further include drilling into the substrate from the first side of the substrate toward the second side of the substrate to the stop pad.

At block 706, the process may further include etching the stop pad.

Figure 8:
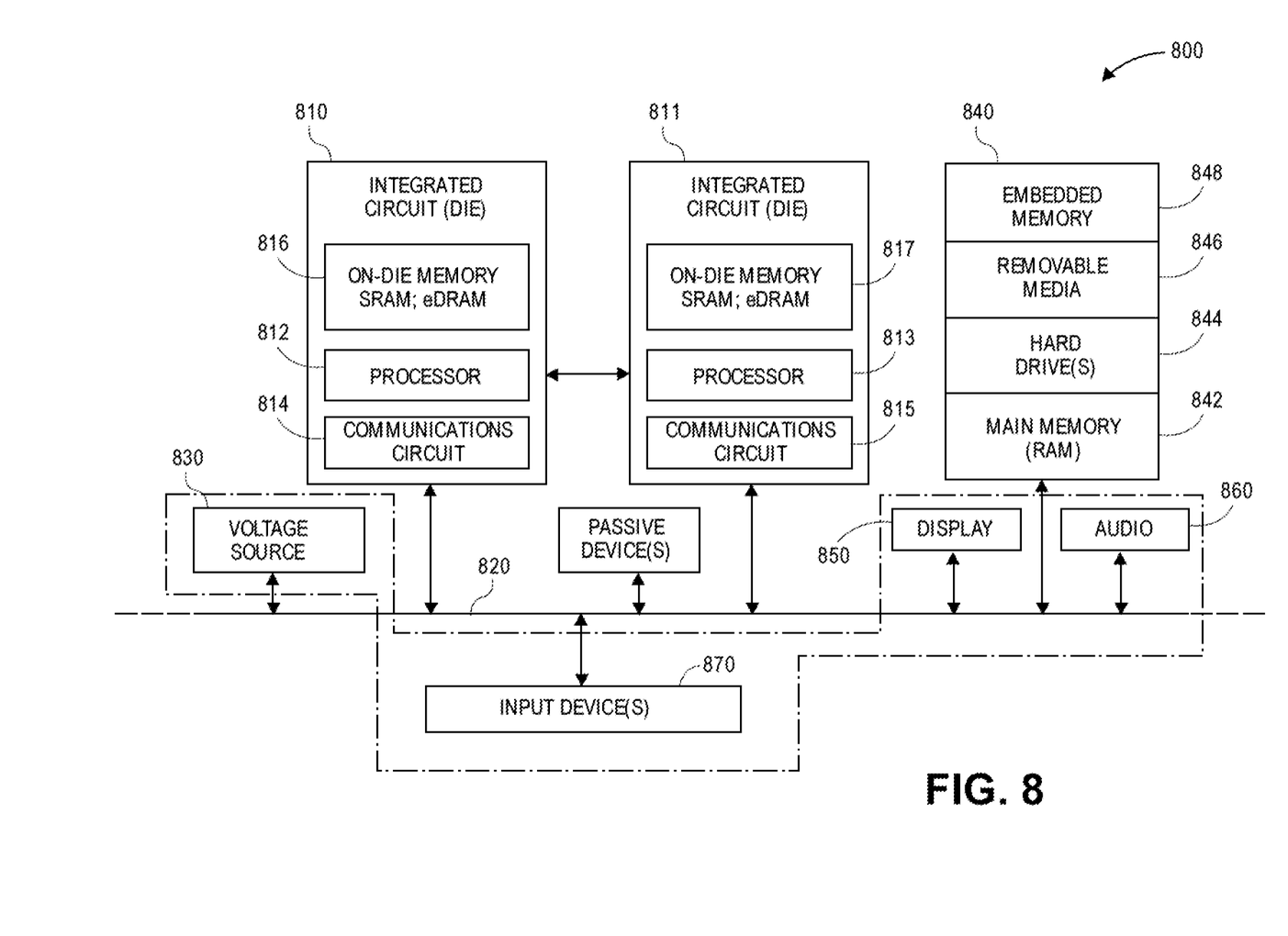
FIG. 8 schematically illustrates a computing device, in accordance with various embodiments.

FIG. 8 is a schematic of a computer system 800, in accordance with an embodiment of the present invention. The computer system 800 (also referred to as the electronic system 800) as depicted can embody a substrate cavity with stepped walls, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a substrate cavity with stepped walls, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a substrate cavity with stepped walls, according to any of the several disclosed embodiments and their equivalents, an electronic system, a computer system, one or more methods of fabricating an integrated circuit, and one or more methods of fabricating an electronic assembly that includes a package substrate having a substrate cavity with stepped walls, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a substrate cavity with stepped walls embodiments and their equivalents. A foundation substrate may be included, as represented by the dashed line of FIG. 8. Passive devices may also be included, as is also depicted in FIG. 8.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a substrate having a first side and a second side opposite the first side; a cavity formed in the substrate, the cavity starting at a location on the first side of the substrate and extending toward the second side of the substrate; and wherein at least one wall of the cavity that extends from the first side of the substrate toward the second side of the substrate includes one or more levels forming a stepped pattern.

Example 2 includes the apparatus of example 1, wherein at least one of the one or more levels includes a recess into the wall.

Example 3 includes the apparatus of example 1, wherein each level includes a surface that is substantially parallel with the first side of the substrate.

Example 4 includes the apparatus of example 1, wherein the recess into the wall is formed by an etched copper stop pad within the substrate.

Example 5 includes the apparatus of example 1, wherein a level corresponds with a layer of the substrate.

Example 6 includes the apparatus of example 1, wherein the cavity is at an edge of the substrate.

Example 7 includes the apparatus of example 1, wherein a bottom of the cavity is formed by one or more layers of the substrate.

Example 8 includes the apparatus of example 1, wherein a depth of the cavity is based upon a depth of a photonic integrated circuit (PIC).

Example 9 includes the apparatus of any one of examples 1-8, wherein the cavity is a first cavity; and further comprising a second cavity formed in the substrate, the second cavity starting at another location on the first side of the substrate and extending toward the second side of the substrate.

Example 10 includes a method comprising: identifying a substrate having a first side and a second side opposite the first side, wherein the substrate includes a plurality of layers, wherein at least one of the layers includes a stop pad; drilling into the substrate from the first side of the substrate toward the second side of the substrate to the stop pad; and etching the stop pad.

Example 11 includes the method of example 10, wherein the stop pad is a copper stop pad.

Example 12 includes the method of example 10, wherein drilling into the substrate further includes drilling into the substrate using a CO2 laser drill.

Example 13 includes the method of example 10, wherein the stop pad protects at least one of the one or more layers of the substrate below the stop pad from damage.

Example 14 includes the method of any one of examples 10-13, wherein the stop pad is a first stop pad, and further comprising after etching the first stop pad: drilling into the substrate from the first side of the substrate toward the second side of the substrate to the second stop pad, wherein the second stop pad is located in a substrate layer below the first stop pad; and etching the second stop pad.

Example 15 is a package comprising: a substrate, the substrate including: a first side and a second side opposite the first side; a cavity formed in the substrate, the cavity starting at a location on the first side of the substrate and extending toward the second side of the substrate; and wherein at least one wall of the cavity that extends from the first side of the substrate toward the second side of the substrate includes one or more levels forming a stepped pattern; and a photonics integrated circuit (PIC) located in the cavity.

Example 16 includes the package of example 15, wherein the PIC has a first side and a second side opposite the first side; and wherein the first side of the PIC is substantially planar with the first side of the substrate.

Example 17 includes the package of example 16, further comprising: a die electrically and physically coupled with the first side of the PIC.

Example 18 includes the package of any one of examples 15-17, further comprising a lens disposed within the cavity and optically coupled with the PIC.

Example 19 includes the package of any one of examples 15-17, wherein the cavity is formed at an edge of the substrate.

Example 20 includes the package of example 19, wherein the lens extends beyond the edge of the substrate.

What is claimed is:

1. An apparatus comprising:
   a package substrate having a first side and a second side opposite the first side;
   a cavity formed in the package substrate, the cavity starting at a location on the first side of the package substrate and extending toward the second side of the package substrate; and
   wherein at least one wall of the cavity that extends from the first side of the package substrate toward the second side of the package substrate includes one or more levels forming a stepped pattern.

2. The apparatus of claim 1, wherein at least one of the one or more levels includes a recess into the wall.

3. The apparatus of claim 1, wherein each level includes a surface that is substantially parallel with the first side of the package substrate.

4. The apparatus of claim 1, wherein the recess into the wall is formed by an etched copper stop pad within the package substrate.

5. The apparatus of claim 1, wherein a level corresponds with a layer of the package substrate.

6. The apparatus of claim 1, wherein the cavity is at an edge of the package substrate.

7. The apparatus of claim 1, wherein a bottom of the cavity is formed by one or more layers of the package substrate.

8. The apparatus of claim 1, wherein a depth of the cavity is based upon a depth of a photonic integrated circuit (PIC).

9. The apparatus of claim 1, wherein the cavity is a first cavity; and further comprising a second cavity formed in the package substrate, the second cavity starting at another location on the first side of the package substrate and extending toward the second side of the package substrate.

10. A method comprising:
    providing a package substrate having a first side and a second side opposite the first side, wherein the package substrate includes a plurality of layers, wherein at least one of the layers includes a stop pad;
    drilling into the package substrate from the first side of the package substrate toward the second side of the package substrate to the stop pad to form a cavity that extends from the first side of the package substrate toward the second side of the package substrate, the cavity having a cavity wall that includes one or more levels forming a stepped pattern; and
    etching the stop pad.

11. The method of claim 10, wherein the stop pad is a copper stop pad.

12. The method of claim 10, wherein drilling into the package substrate further includes drilling into the package substrate using a $CO_2$ laser drill.

13. The method of claim 10, wherein the stop pad protects at least one of the one or more layers of the package substrate below the stop pad from damage.

14. The method of claim 10, wherein the stop pad is a first stop pad, and further comprising after etching the first stop pad:
    drilling into the package substrate from the first side of the package substrate toward the second side of the package substrate to the second stop pad, wherein the second stop pad is located in a package substrate layer below the first stop pad; and
    etching the second stop pad.

15. A package comprising:
    a package substrate, the package substrate including:
    a first side and a second side opposite the first side;
    a cavity formed in the package substrate, the cavity starting at a location on the first side of the package substrate and extending toward the second side of the package substrate; and
    wherein at least one wall of the cavity that extends from the first side of the package substrate toward the second side of the package substrate includes one or more levels forming a stepped pattern; and
    a photonics integrated circuit (PIC) located in the cavity.

16. The package of claim 15, wherein the PIC has a first side and a second side opposite the first side; and wherein the first side of the PIC is substantially planar with the first side of the package substrate.

17. The package of claim 16, further comprising:
    a die electrically and physically coupled with the first side of the PIC.

18. The package of claim 16, further comprising a lens disposed within the cavity and optically coupled with the PIC.

19. The package of claim 15, wherein the cavity is formed at an edge of the package substrate.

20. The package of claim 19, wherein the lens extends beyond the edge of the package substrate.

* * * * *